United States Patent
Bojarczuk, Jr. et al.

(10) Patent No.: US 7,745,278 B2
(45) Date of Patent: Jun. 29, 2010

(54) SELECTIVE IMPLEMENTATION OF BARRIER LAYERS TO ACHIEVE THRESHOLD VOLTAGE CONTROL IN CMOS DEVICE FABRICATION WITH HIGH K DIELECTRICS

(75) Inventors: Nestor A. Bojarczuk, Jr., Poughkeepsie, NY (US); Cyril Cabral, Jr., Mahopac, NY (US); Eduard A. Cartier, New York, NY (US); Matthew W. Copel, Yorktown Heights, NY (US); Martin M. Frank, New York, NY (US); Evgeni P. Gousev, Mahopac, NY (US); Supratik Guha, Chappaqua, NY (US); Rajarao Jammy, Hopewell Junction, NY (US); Vijay Narayanan, New York, NY (US); Vamsi K. Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/211,530

(22) Filed: Sep. 16, 2008

(65) Prior Publication Data
US 2009/0011610 A1    Jan. 8, 2009

Related U.S. Application Data

(60) Continuation of application No. 11/500,254, filed on Aug. 7, 2006, now Pat. No. 7,452,767, which is a division of application No. 10/863,830, filed on Jun. 4, 2004, now Pat. No. 7,105,889.

(51) Int. Cl.
*H01L 21/8238* (2006.01)

(52) U.S. Cl. .............. 438/199; 438/216; 438/261; 438/287; 438/591; 257/E21.202; 257/E21.639

(58) Field of Classification Search ........... 438/199, 438/216, 261, 287, 591; 257/E21.202, E21.639
See application file for complete search history.

(56) References Cited

U.S. PATENT DOCUMENTS 5,668,028 A    9/1997    Bryant (Continued)

FOREIGN PATENT DOCUMENTS

KR    2003-0080845 A    10/2003

*Primary Examiner*—Andy Huynh
(74) *Attorney, Agent, or Firm*—Scully, Scott, Murphy & Presser, P.C.; Louis J. Percello, Esq.

(57) ABSTRACT

A method of forming a CMOS structure, and the device produced therefrom, having improved threshold voltage and flatband voltage stability. The inventive method includes the steps of providing a semiconductor substrate having an nFET region and a pFET region; forming a dielectric stack atop the semiconductor substrate comprising an insulating interlayer atop a high k dielectric; removing the insulating interlayer from the nFET region without removing the insulating interlayer from the pFET region; and providing at least one gate stack in the pFET region and at least one gate stack in the nFET region. The insulating interlayer can be AlN or $AlO_xN_y$. The high k dielectric can be $HfO_2$, hafnium silicate or hafnium silicon oxynitride. The insulating interlayer can be removed from the nFET region by a wet etch including a $HCl/H_2O_2$ peroxide solution.

22 Claims, 5 Drawing Sheets

U.S. PATENT DOCUMENTS

| | | |
|---|---|---|
| 5,763,922 A | 6/1998 | Chau |
| 6,040,769 A | 3/2000 | Payne |
| 6,407,435 B1 | 6/2002 | Ma et al. |
| 6,538,278 B1 | 3/2003 | Chau |
| 6,541,079 B1 | 4/2003 | Bojarczuk, Jr. et al. |
| 6,803,248 B2 | 10/2004 | Sadaka et al. |
| 6,831,339 B2 | 12/2004 | Bojarczuk et al. |
| 7,148,100 B2 | 12/2006 | Kim et al. |
| 7,244,645 B2 | 7/2007 | Kim et al. |
| 2005/0258491 A1 | 11/2005 | Bojarczuk et al. |

SELECTIVE IMPLEMENTATION OF BARRIER LAYERS TO ACHIEVE THRESHOLD VOLTAGE CONTROL IN CMOS DEVICE FABRICATION WITH HIGH K DIELECTRICS

RELATED APPLICATIONS

This application is a continuation of U.S. application Ser. No. 11/500,254 filed Aug. 7, 2006, which is a divisional of U.S. application Ser. No. 10/863,830, filed Jun. 4, 2004.

FIELD OF THE INVENTION

The present invention generally relates to a semiconductor device, and more particularly to a complementary metal oxide semiconductor (CMOS) structure having nFET and pFET device regions, which incorporates an insulating interlayer between a gate conductor and a high k gate dielectric in at least one pFET device of the pFET device region without incorporating the insulating interlayer into the nFET device region, wherein the insulating interlayer stabilizes the threshold voltage $V_t$ and flatband voltage $V_{fb}$ of the pFET devices without substantially impacting the threshold voltage $V_t$ and flatband voltage $V_{fb}$ of the devices within the nFET device region.

BACKGROUND OF THE INVENTION

In standard silicon complementary metal oxide semiconductor (CMOS) technology, p-type field effect transistors (pFET) use a boron (or other acceptor) doped p-type polysilicon layer as a gate conductor that is deposited on top of a silicon dioxide or silicon oxynitride gate oxide layer. The gate voltage is applied through this polysilicon layer to create an inversion channel in the n-type silicon underneath the gate oxide layer.

For a pFET to work properly, the inversion should begin occurring at slightly negative voltages applied to the polysilicon (poly-Si) gate conductor. This occurs as a consequence of the band alignment for the gate stack structure as depicted in FIG. 1. Specifically, FIG. 1 shows the approximate band alignment across a poly-Si/gate oxide gate stack in a typical pFET at zero gate bias. In FIG. 1, $E_c$, $E_v$ and $E_f$ are the conduction band edge, valence band edge and the Fermi level in the silicon, respectively. The poly-Si/gate oxide/n-type silicon stack forms a capacitor that swings into inversion at around 0 V and into accumulation around +1 V (depending on the substrate doping). The threshold voltage $V_t$, which can be interpreted as the voltage at which the inversion starts occurring, is therefore approximately 0 V and the flatband voltage $V_{fb}$, which is the voltage just beyond which the capacitor starts to swing into accumulation, is approximately +1 V. The exact values of the threshold $V_t$ and flatband voltages $V_{fb}$ have a dependence on the doping level in the silicon substrate, and can be varied somewhat by choosing an appropriate substrate doping level.

In future technology, silicon dioxide or silicon oxynitride dielectrics will be replaced with a gate material that has a higher dielectric constant. These materials are known as "high k" materials with the term "high k" denoting an insulating material whose dielectric constant is greater than 4.0, preferably greater than about 7.0. The dielectric constants mentioned herein are relative to a vacuum unless otherwise specified. Of the various possibilities, hafnium oxide, hafnium silicate, or hafnium silicon oxynitride may be the most suitable replacement candidates for conventional gate dielectrics due to their excellent thermal stability at high temperatures.

Unfortunately, when p-type field effect transistors are fabricated using a dielectric such as hafnium oxide or hafnium silicate, it is a well known problem that the flatband voltage $V_{fb}$ of the device is shifted from its ideal position of close to about +1 V, to about 0+/−300 mV. This shift in flatband voltage $V_{fb}$ is published in C. Hobbs et al., entitled "Fermi Level Pinning at the Poly-Si/Metal Oxide Interface", 2003 Symposium on VLSI Technology Digest of Technical Papers. Consequently, the threshold voltage $V_t$ of the device is shifted to approximately −1 V. This threshold voltage $V_t$ shift is believed to be a consequence of an intimate interaction between the Hf-based gate oxide layer and the polysilicon layer. One model (See, for example, C. Hobbs, et al., ibid.) speculates that such an interaction causes an increase in the density of states in the silicon band gap at the polysilicon-gate oxide interface, leading to "Fermi level pinning". The threshold voltage $V_t$ therefore is not in the "right" place, i.e., it is too high for a useable CMOS (complementary metal oxide semiconductor) technology.

It had been shown recently that the threshold voltage $V_t$ shift resulting from the incorporation of the high k gate dielectric can be considerably controlled using a thin (5-15 Å) insulating interlayer, such as aluminum nitride (AlN), between the high k dielectric (HfSiO) and the polysilicon gate conductor. FIG. 2 depicts the capacitance v. voltage plot of a pFET device having a 2.5 nm thick $SiO_2$ dielectric layer (control), as indicated by reference number 1; a pFET device having a 3.0 nm HfSiO high k dielectric atop a 1.0 nm $SiO_2$ dielectric layer, as indicated by reference number 2; and a pFET device having an AlN insulating interlayer atop a 3.0 nm HfSiO high k dielectric atop a 1.0 nm $SiO_2$ dielectric layer, as indicated by reference number 3.

Still referring to FIG. 2, comparison of the capacitance v. voltage plot for the pFET with 3.0 nm HfSiO high k dielectric atop a 1.0 nm $SiO_2$ dielectric layer to the capacitance v. voltage plot for the pFET device having an AlN insulating interlayer atop a 3.0 nm HfSiO high k dielectric atop a 1.0 nm $SiO_2$ dielectric layer reveals a positive shift of approximately 400 mV in the threshold voltage $V_t$ and the flatband voltage $V_{fb}$ of the pFET device incorporating the AlN insulating interlayer, wherein the threshold $V_t$ and flatband voltages $V_{fb}$ are shifted towards their operating values. The effects of the insulating interlayer on the threshold voltage $V_t$ in pFET devices is discussed in greater detail in co-pending and co-assigned U.S. Patent Application Publication No. 2005-0258491, entitled ALUMINUM NITRIDE BASED THRESHOLD AND FLATBAND VOLTAGE PRESERVATION LAYER IN POLYSILICON BASED P-TYPE FILED EFFECT TRANSISTORS, filed May 14, 2004, the entire content and subject matter of which is incorporated herein by reference.

However, applicants have determined that the presence of the AlN insulating interlayer between the polysilicon gate conductor and high k dielectric in nFET devices disadvantageously results in a positive threshold voltage $V_t$ shift, as shown in FIG. 3. FIG. 3 depicts capacitance v. voltage curves for an nFET device comprising a 2.5 nm thick $SiO_2$ dielectric layer (control), as indicated by reference number 1'; an NFET device comprising a 3.0 nm HfSiO high k dielectric atop a 1.0 nm $SiO_2$ dielectric layer, as indicated by reference number 2'; and an nFET device comprising an AlN insulating interlayer atop a 3.0 nm HfSiO high k dielectric atop a 1.0 nm $SiO_2$ dielectric layer, as indicated by reference number 3'.

Comparison of the capacitance v. voltage plot of the nFET device comprising an AlN insulating interlayer atop a 3.0 nm HfSiO high k dielectric atop a 1.0 nm $SiO_2$ dielectric layer to the capacitance v. voltage plot for the nFET device comprising a 2.5 nm thick $SiO_2$ dielectric layer (control) reveals a positive shift in the threshold voltage $V_t$, on the order of about 400 mV away from the capacitance v. voltage plot for the nFET device comprising a 2.5 nm thick $SiO_2$ dielectric layer (control). The positive shift in the threshold voltage $V_t$ due to the incorporation of the AlN insulating interlayer within the nFET device is an equally unfavorable characteristic as the original negative shift in the threshold voltage $V_t$ of the pFET device, without the AlN insulating interlayer.

Prior methods to remove the AlN insulating layer from the nFET device region, without destroying the underlying nFET device region surface or removing the AlN insulating layer from the pFET device region, are not known. Prior etchants such as KOH or dry reactive etching techniques are undesirable due to their deleterious impact on the underlying high k dielectric.

In view of the above mentioned problem of controlling the threshold voltage $V_t$ and flatband voltage $V_{fb}$ shift, it has been nearly impossible to develop a high k gate dielectric CMOS technology that is capable of simultaneously stabilizing the threshold and flatband voltage $V_t$, $V_{fb}$ for both nFET and pFET devices. As such, a method and structure that is capable of stabilizing the threshold voltage $V_t$ and flatband voltage $V_{fb}$ for both nFET and pFET devices containing a gate stack including a high k dielectric is needed.

SUMMARY OF THE INVENTION

It is an object of the present invention to provide a CMOS structure that stabilizes the threshold voltage $V_t$ and flatband voltage $V_{fb}$ for both nFET and pFET devices. It is another objective of the present invention to provide a CMOS structure having an insulating interlayer, e.g. AlN, present only in the pFET devices, in which the insulating interlayer stabilizes the threshold voltage $V_t$ and flatband voltage $V_{fb}$ of the pFET devices, without degrading the stability of the threshold voltage and flatband voltage of the nFET devices.

The present invention advantageously stabilizes the threshold voltage $V_t$ and flatband voltage $V_{fb}$ in pFET devices by providing an insulating interlayer between the high k dielectric and the gate conductor, wherein the insulating interlayer prevents interaction between the high k gate dielectric and the gate conductor by spatial separation. The threshold $V_t$ and flatband voltage V. shift attributed to the incorporation of the insulating interlayer in the NFET devices is stabilized by removing the insulating interlayer from the nFET devices, without etching the nFET devices or removing the insulating interlayer from the pFET device region. In broad terms, the inventive method for providing a CMOS structure having high k dielectric pFET and nFET devices comprises the steps of:

providing a semiconducting substrate having a first device region and a second device region;

forming a dielectric stack atop said semiconducting substrate including said first device region and said second device region, said dielectric stack comprising an insulating interlayer atop a high k dielectric;

removing said insulating interlayer from said first device region, without removing said insulating interlayer from said second device region; forming a gate conductor atop said insulating interlayer in said second device region and said high k dielectric in said first device region; and etching said gate conductor, said insulating interlayer and said high k dielectric to provide at least one gate stack in said second device region and at least one gate stack in said first device region.

In accordance with the present invention, the first device region is the area in which nFET devices are formed, while the second device region is the area in which pFET devices are formed. The insulating interlayer employed in the present invention is any insulating material that is capable of preventing interaction between the high k gate dielectric and the gate conductor by spatial separation. Moreover, the insulating interlayer employed in the present invention has a sufficiently high dielectric constant (on the order of about 4.0 or greater) such that there is a minimal decrease in gate capacitance (due to series capacitance effect) with its addition. The insulating interlayer of the present invention is substantially non-reactive with the underlying high k gate dielectric; therefore it does not react with the high k gate dielectric forming a silicide. The insulating interlayer of the present invention is also non-reactive with the above lying gate conductor.

Another characteristic feature of the inventive insulating interlayer is that it is chemically stable so that silicon cannot reduce it. In cases in which some dissociation of the inventive insulating interlayer may occur, the inventive insulating interlayer should not be an n-type dopant to silicon. Rather, the inventive insulating interlayer can be either a p-type dopant or a neutral dopant so that device performance is not adversely affected. Also, the insulating interlayer employed in the present invention should be a refractory compound that is able to withstand high temperatures (of approximately 1000° C., typical of standard CMOS processing).

Insulating materials that fit the above mentioned criteria and are thus employed as the insulating interlayer of the present invention include any insulating metal nitride, i.e., metal nitride containing material, that may optional include oxygen therein. Examples of insulating interlayers include, but are not limited to: aluminum nitride (AlN), aluminum oxynitride ($AlO_xN_y$), boron nitride (BN), boron oxynitride ($Bo_xN_y$), gallium nitride (GaN), gallium oxynitride (GaON), indium nitride (InN), indium oxynitride (InON) and combinations thereof. The insulating interlayer is a thin interlayer located between the high k gate dielectric and the gate conductor. Typically, the insulating interlayer has a thickness in the range from about 1 to about 25 Å, with a thickness from about 2 to about 15 Å being more typical. The insulating interlayer is formed by deposition or thermal growing. The deposition comprises plating, sputtering, atomic layer chemical vapor deposition (ALCVD) or metal organic chemical vapor deposition (MOCVD).

The high k dielectric comprises any dielectric material having a dielectric constant greater than 4.0, preferably being greater than 7.0. In a highly preferred embodiment of the present invention, the high k dielectric comprises $HfO_2$, hafnium silicate or hafnium silicon oxynitride. The high k dielectric is formed by deposition or thermal growing. Thermal growing may comprise oxidation, nitridation, and/or oxynitridation. Deposition may comprise chemical vapor deposition (CVD), plasma-enhanced CVD (PECVD), metal organic chemical vapor deposition (MOCVD), high-density chemical vapor deposition (HDCVD), plating, sputtering, evaporation and/or chemical solution deposition.

Removing the insulating interlayer from the first device region, without removing the insulating interlayer from the second device region, can include forming a block mask atop the second device region, wherein the first device region is exposed; and etching the insulating interlayer from the first device region. The insulating interlayer may be etched by an etch chemistry that removes the insulating interlayer without substantially etching the block mask positioned in the second device region and the portion of the high k dielectric positioned underlying the insulating interlayer in the first device region.

Another aspect of the present invention is the CMOS structure provided by the above method. Broadly, the present invention provides a CMOS structure comprising:

a semiconductor substrate having a first device region and a second device region;

said first device region comprising at least one first gate stack comprising a first high k gate dielectric and a first gate conductor, said second device region comprising at least one second gate stack comprising a second high k dielectric, an insulating interlayer atop said high k gate, and a second gate conductor atop said insulating layer, wherein said insulating interlayer is capable of stabilizing said second device regions threshold voltage and flatband voltage without shifting said first device regions threshold voltage and flatband voltage.

DETAILED DESCRIPTION OF THE INVENTION

The present invention, which provides a CMOS structure having an insulating interlayer (e.g., AlN interlayer) between a high k gate dielectric and a gate conductor of at least one pFET device, without incorporating the insulating interlayer into the NFET devices, wherein the positioning of the insulating interlayer stabilizes the threshold voltage $V_t$ and flatband voltage $V_{fb}$ for both pFET and nFET devices, and a method of fabricating the same will now be described in greater detail. The term "insulating interlayer" denotes a metal-nitride containing interlayer which can include metal nitride and metal oxynitride materials.

Figure 1:
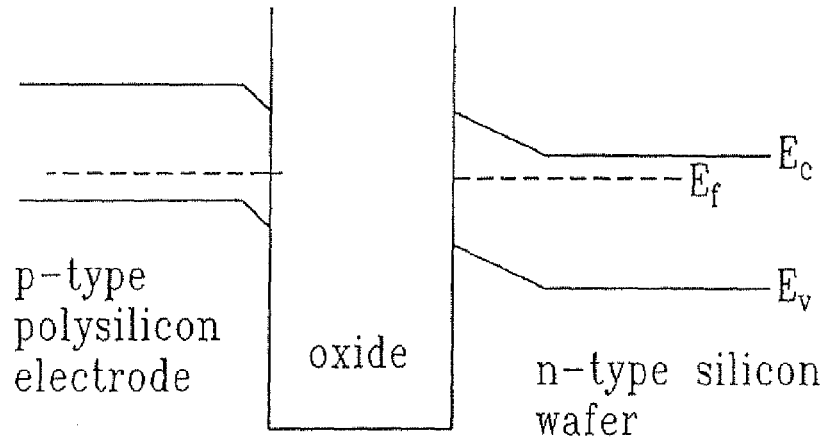
FIG. 1 is a schematic showing approximate band alignment across a prior art gate stack in a typical pFET at zero gate bias, $V_g=0$ V. The quantities $E_c$ and $E_v$ denote the conduction and the valence band edge, respectively, in the silicon substrate and in the polysilicon gate. $E_f$ denotes the Fermi level position (dotted line) in the silicon substrate and in the polysilicon gate at zero gate bias.
Figure 2:
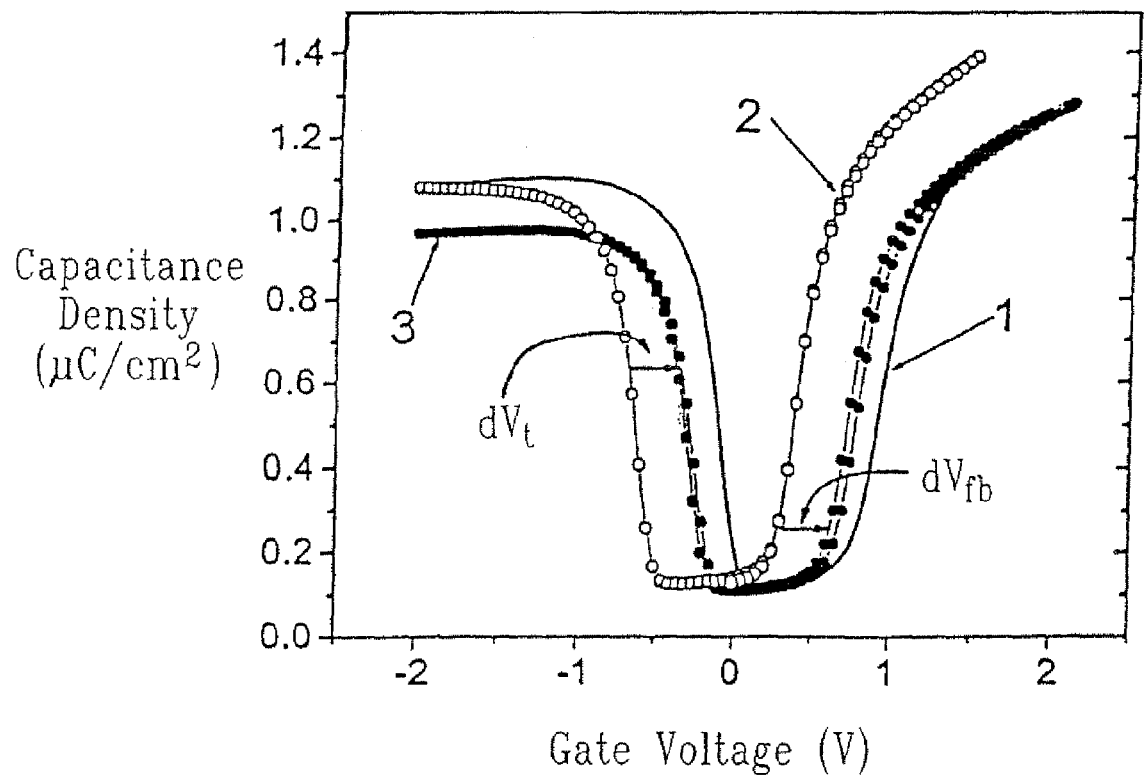
FIG. 2 is a graph showing the capacitance-voltage curves for three types of pFET devices. The capacitance voltage curves include a plot for a pFET comprising a AlN threshold insulating interlayer on a 3 nm HfSiO high k dielectric on a 1 nm $SiO_2$ dielectric layer; a pFET comprising a 3 nm HfSiO high k dielectric on a 1 nm n $SiO_2$ dielectric layer; and a pFET comprising a 2.5 nm thick $SiO_2$ dielectric layer.
Figure 3:
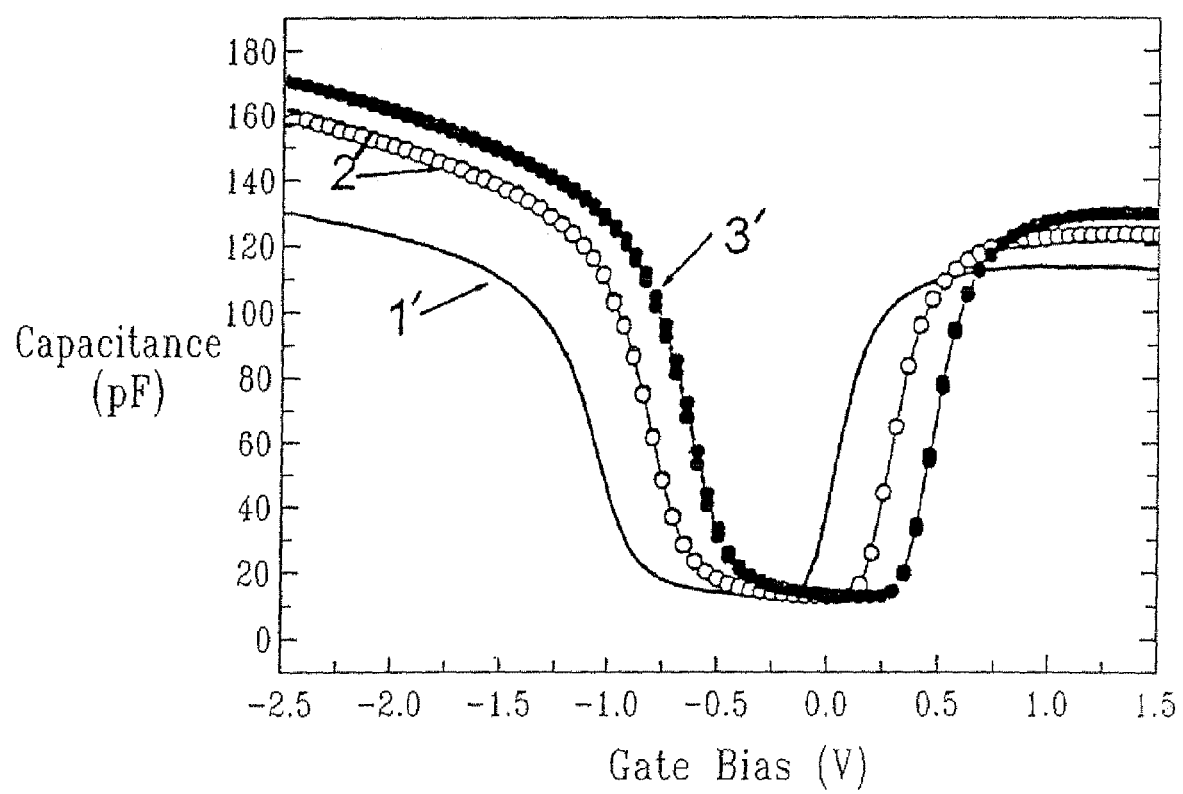
FIG. 3 is a graph showing the capacitance-voltage curves for three types of nFET devices. The capacitance voltage curves include a plot for an nFET comprising a AlN threshold insulating interlayer on a 3 nm HfSiO high k dielectric on a 1 nm $SiO_2$ dielectric layer; an nFET comprising a 3 nm HfSiO high k dielectric on a 1 nm $SiO_2$ dielectric layer; and an NFET comprising a 2.5 nm thick $SiO_2$ dielectric layer.
Figure 4:
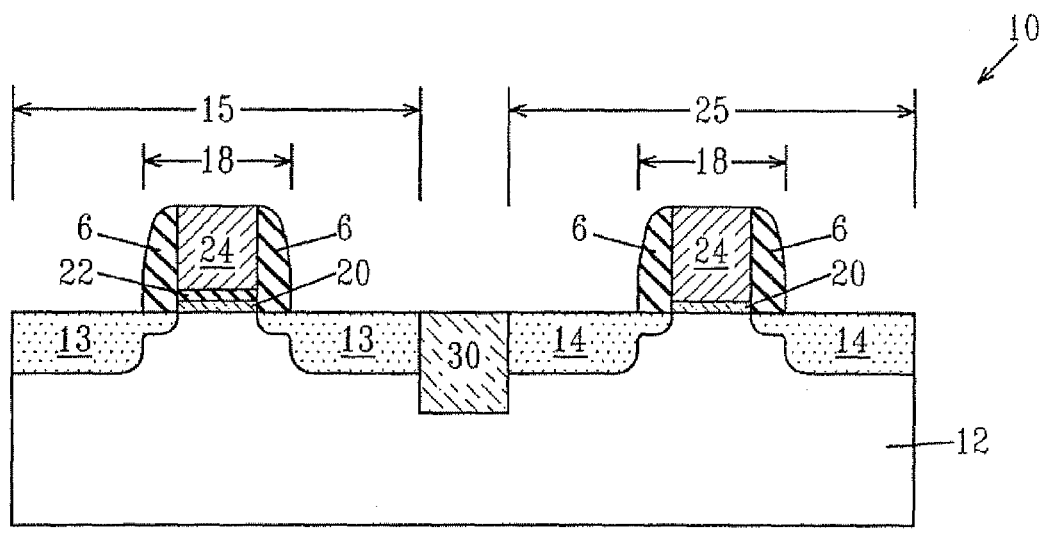
FIG. 4 is a pictorial representation (through a cross sectional view) of the inventive CMOS structure that includes a pFET device region having a threshold voltage $V_t$ stabilizing insulating interlayer between a high k gate dielectric and a poly-Si gate conductor and an nFET device region from which the insulating interlayer has been removed using the selective etch process of the present invention.

Reference is made to FIG. 4, which is a pictorial representation (through a cross sectional view) showing the CMOS structure 10 of the present invention. Specifically, the CMOS structure 10 includes a semiconductor substrate 12 having a pFET device region 15 and an nFET device region 25 separated by an isolation region 30. Although the drawings show the presence of only two field effect transistors (FETs) on one substrate 12, multiple FETs are also within the scope of the present invention.

The pFET device region 15 comprises at least one pFET having p-type source/drain regions 13. Each of the pFETs comprises a gate region 18 having a gate conductor 24 atop an insulating interlayer 22 atop a high k dielectric 20. At least one set of sidewall spacers 6 are positioned abutting the gate conductor 24.

The nFET device region 25 comprises at least one NFET having n-type source/drain regions 14. Each of the pFETs further comprises a gate region 18, including a gate conductor 24 atop a high k dielectric 20, in which the gate conductor 24 is abutted by at least one set of sidewall spacers 6.

One aspect of the structure depicted in FIG. 4 is that the insulating interlayer 22 is positioned to stabilize the threshold voltage $V_t$ and flatband voltage $V_{fb}$ in pFET devices, without shifting the threshold voltage $V_t$ and flatband voltage $V_{fb}$ of the nFET devices, thereby providing a solution to the fabrication of CMOS transistors with the appropriate threshold and flatband voltages.

The insulating interlayer 22 employed in the present invention has at least one of the following characteristics: (i) it is capable of preventing interaction between the high k gate dielectric 20 and the gate conductor 24 by spatial separation; (ii) it has a sufficiently high dielectric constant (on the order of about 4.0 or greater) such that there is a minimal decrease in gate capacitance (due to series capacitance effect) because of its addition; (iii) it may dissociate, at least partially, to provide a supply of p-type dopants in the near interfacial layer to ensure p-type behavior of near interfacial Si-containing material of the gate conductor 24 in the pFET device region 15; (iv) it can prevent outdiffusion of atoms from the high k gate dielectric 20 to the gate conductor 24; and (v) it can prevent oxidation under the gate conductor 24.

Examples of insulating interlayers 22 include aluminum nitride (AlN), aluminum oxynitride ($AlO_xN_y$), boron nitride (BN), boron oxynitride ($BO_xN_y$), gallium nitride (GaN), gallium oxynitride (GaON), indium nitride (InN), indium oxynitride (InON) and combinations thereof. In a highly preferred embodiment, the insulating interlayer 22 is AlN. The various components of the structure shown in FIG. 4 as well as the process that can be used in forming the same will now be described in greater detail referring to FIGS. 5-8.

Figure 5:
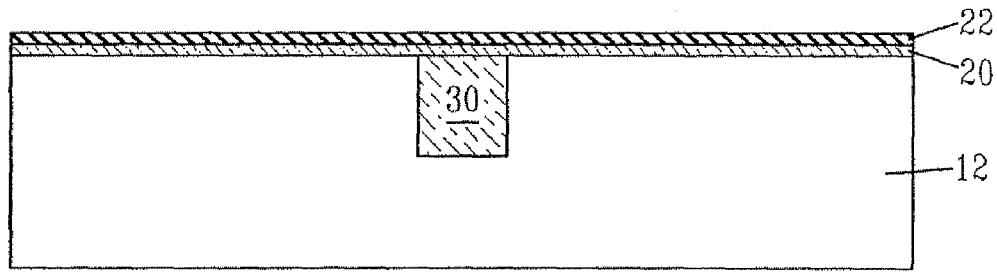
FIGS. 5-8 are pictorial representations (through a cross sectional views) of the process steps for the inventive method, which provides the CMOS structure depicted in FIG. 4.

Referring to FIG. 5, during initial processing steps, blanket layers of high k dielectric 20 and insulating interlayer 22 are formed on a surface of a semiconductor substrate 12. In accordance with the present invention, the high k dielectric 20 is located between the insulating interlayer 22 and the semiconductor substrate 12.

The semiconductor substrate 12 employed in the present invention comprises any semiconducting material including, but not limited to: Si, Ge, SiGe, SiC, SiGeC, Ga, GaAs, InAs, InP and all other III/V or II/VI compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

The semiconductor substrate 12 may also include a first doped (n- or p-) region, and a second doped (n- or p-) region. For clarity, the doped regions are not specifically shown in the drawing of the present application. The first doped region and the second doped region may be the same, or they may have different conductivities and/or doping concentrations. These doped regions are known as "wells".

At least one isolation region 30 is then typically formed into the semiconductor substrate 12. The isolation region 30 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities. The neighboring gate regions can have the same conductivity (i.e., both n- or p-type), or alternatively they can have different conductivities (i.e., one n-type and the other p-type).

After forming the at least one isolation region 30 within the semiconductor substrate 12, a high k gate dielectric 20 is formed on a surface of the structure. The high k gate dielectric 20 can be formed by a thermal growth process such as, for example, oxidation, nitridation or oxynitridation. Alternatively, the high k gate dielectric 20 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The high k gate dielectric 20 may also be formed utilizing any combination of the above processes.

The high k gate dielectric 20 is comprised of an insulating material having a dielectric constant of greater than about 4.0, preferably greater than 7.0. Specifically, the high k gate dielectric 20 employed in the present invention includes, but is not limited to: oxide, nitride, oxynitride and/or silicate including metal silicates and nitrided metal silicates. In one embodiment, it is preferred that the gate dielectric 20 is comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Highly preferred examples of high k dielectrics 20 include $HfO_2$, hafnium silicate and hafnium silicon oxynitride.

The physical thickness of the high k gate dielectric 20 may vary, but typically, the high k gate dielectric 20 has a thickness from about 0.5 to about 10 nm, with a thickness from about 0.5 to about 3 nm being more typical. It may be deposited above a thin (on the order of about 0.1 to about 1.5 nm) layer of silicon oxide or silicon oxynitride that is first deposited on the substrate.

In one embodiment of the present invention, the high k dielectric may be selectively deposited on portions of the substrate using block masks as known within the skill of the art. In this embodiment, a first portion of the substrate may be processed to provide a first high k dielectric for a first device type, such as an nFET, and a second portion of the substrate may be processed to provide a second high k dielectric for a second device type, such as a pFET.

Next, insulating interlayer 22 is formed atop the blanket layer of high k gate dielectric 20. The insulating interlayer 22 of the present invention is a chemical interlayer that prevents interaction between the high k gate dielectric 20 and the subsequently formed gate conductor 24. The insulating interlayer 22 of the present invention is substantially non-reactive (there may be slight or partial decomposition, such as when its acts as a dopant source) with the underlying high k dielectric 20; therefore it does not react with the high k dielectric 20 to form a silicide. Another characteristic feature of the inventive insulating interlayer 22 is that silicon cannot reduce the inventive insulating interlayer 22. In cases in which some dissociation of the inventive interlayer 22 may occur, the inventive interlayer 22 should be either a p-type dopant or a neutral dopant so that device performance is not adversely affected. Preferably, the p-type dopants does not dissociate into the portion of the device in which nFET devices are subsequently formed. Also, the insulating interlayer 22 employed in the present invention should be a refractory compound that is able to withstand high temperatures (of approximately 1000° C., typical of standard CMOS processing).

Insulating materials that fit the above-mentioned criteria and are thus employed as the insulating interlayer 22 of the present invention include any insulating metal nitride that may optional include oxygen therein. Examples of insulating interlayers include, but are not limited to: aluminum nitride (AlN), aluminum oxynitride ($AlO_xN_y$), boron nitride (BN), boron oxynitride ($BO_xN_y$), gallium nitride (GaN), gallium oxynitride (GaON), indium nitride (InN), indium oxynitride (InON) and combinations thereof. In one preferred embodiment of the present invention, the insulating interlayer 22 is AlN or $AlO_xN_y$. The insulating interlayer 22 is a thin layer that typically has a thickness from about 1 to about 25 Å, with a thickness from about 2 to about 15 Å being more typical.

The insulating interlayer 22 can be formed by various deposition processes such as, for example, chemical vapor deposition (CVD), plasma-assisted CVD, atomic layer deposition (ALD) using aluminum and nitrogen-based precursors, physical vapor deposition or molecular beam deposition where the metal is evaporated along with a beam or ambient of atomic or molecular nitrogen (that may be optionally an excited species) and optionally oxygen, metalorganic chemical vapor deposition (MOCVD), atomic layer deposition, sputtering, and the like. Alternatively, the insulating interlayer 22 can be formed by thermal nitridation or oxynitridation of a previously deposited insulating metal layer. Alternatively, the oxynitride of the metal may be created by first depositing the metal nitride, followed by partial oxidation in a suitable oxygen environment to create and oxynitride.

One preferred method of forming the interlayer insulating layer 22 is by evaporating, under a high vacuum, Al from a standard Al effusion cell that is resistively heated, and using a nitrogen, or oxygen and nitrogen beams from commercial radio frequency (RF) atomic nitrogen or nitrogen and oxygen sources. For deposition of the nitride alone, a single RF nitrogen source suffices. For the oxynitride, a second RF source of oxygen may be used. Alternatively, the oxygen may be delivered simply as a molecular beam without an RF source. The process of evaporating under a high vacuum is described, for example, in U.S. Pat. No. 6,541,079, the entire content of which is incorporated herein by reference. The effusion cell typically has a temperature from about 1000° C.-1200° C. during the evaporation process. The evaporation process is typically performed using a RF source having a power from about 200-450 W and a flow rate from about 1-3 sccm. These numbers can also be widely varied from the stated bounds without problems. The substrate temperature is typically kept between 150° C. to 650° C. during deposition. Again, the deposition temperature can also be varied outside the stated ranges. Base vacuum chamber pressure is typically about $5 \times 10^{-10}$ to $2 \times 10^{-9}$ torr.

Notwithstanding the technique employed in forming the same, the insulating interlayer 22 formed in the present invention is a continuous and uniform layer that is present atop the high k gate dielectric 20. By "continuous", it is meant that the insulating interlayer 22 contains no substantial breaks and/or voids therein; by "uniform" it is meant that the insulating interlayer 22 has nearly the same, as deposited, thickness across the structure. The insulating interlayer 22 may be amorphous meaning that it can lack a specific crystal structure. The insulating interlayer 22 may exist in other phases besides amorphous depending on the material used as well as the technique that is used in forming the same.

Figure 6:
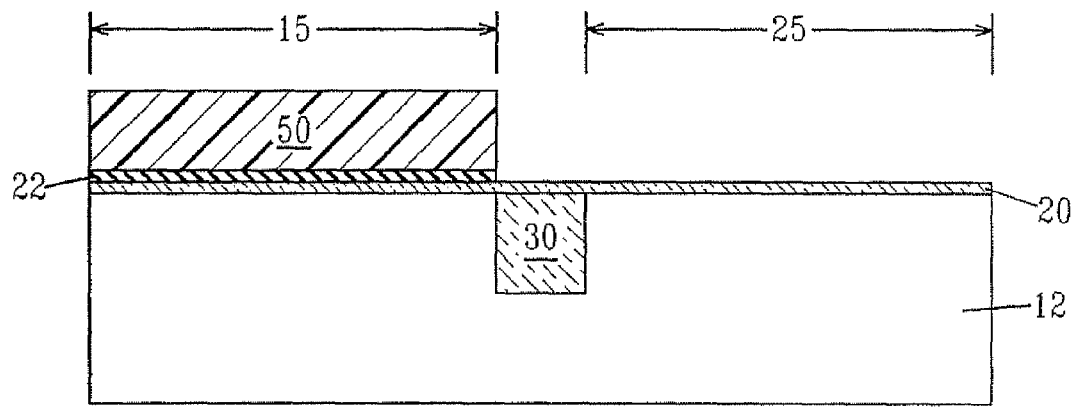

Referring to FIG. 6, following the formation of the insulating interlayer 22, a block mask 50 is formed protecting the portion of the substrate 12 in which pFETs are subsequently formed. This portion of the substrate is hereafter referred to as the pFET device region 15. The exposed portion of the substrate that is not protected by the block mask is subsequently processed to provide nFET devices and is hereafter referred to as the nFET device region 25.

The block mask 50 may comprise conventional soft and/or hardmask materials and can be formed using deposition, photolithography and etching. In a preferred embodiment, the block mask 50 comprises a photoresist. A photoresist block mask 50 can be produced by applying a photoresist layer to the substrate 12 surface, exposing the photoresist layer to a pattern of radiation, and then developing the pattern into the photoresist layer utilizing conventional resist developer.

Alternatively, the block mask 50 can be a hardmask material. Hardmask materials include dielectrics systems that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including but not limited to: silsequioxanes, siloxanes, and boron phosphate silicate glass (BPSG). A block mask 50 comprising hardmask material may be formed by blanket depositing a layer of hardmask material; providing a patterned photoresist atop the layer of hardmask material; and then etching the layer of hardmask material to provide a block mask 50 protecting the pFET device region 15, in which etching comprises an etch chemistry having a high selectivity to the patterned photoresist and the surface of the NFET device region 25.

Still referring to FIG. 6, in a next process step the exposed portion of the insulating interlayer 22 is removed from the nFET device region 25 using a highly selective etch process. This highly selective etch preferably comprises an etch chemistry which removes the exposed portion of the insulating interlayer 22 from the nFET device region 25, without substantially etching the underlying high k dielectric 20 or the block mask 50 that protects the pFET device region 15.

Preferably, a wet etch removes the insulating interlayer 22 from the nFET device region 25, without etching the underlying high k dielectric 20 or the block mask 50. In a preferred embodiment, this etch chemistry removes the AlN insulating interlayer 22, without substantially etching an underlying hafnium silicate high k dielectric 20.

Prior etch methods cannot selectively remove AlN without etching the underlying high k dielectric 20. For example, wet etchants, such as KOH, or dry etch techniques, such as RIE, have a deleterious impact on the underlying high k dielectric 20.

In a preferred embodiment of the present invention, the wet etch chemistry comprises a solution of HCl and peroxide, the preferred concentration being 3:1 $HCl:H_2O_2$. In addition to HCl/peroxide solutions, it is proposed that other inorganic acids and oxidizing agents can produce the same results so long as the etch chemistry does not attack the high k dielectric 20. The oxidizing agents may include peroxides, nitrates, nitrites, perchlorates, chlorates, chlorites, hypochlorites, dichromates, permanganates, persulfates or combinations thereof. The inorganic acids can include sulfuric acid, phosphoric acid or combinations thereof. Etch rate may be impacted by the pH of the etch chemistry. The pH of the etch chemistry may range from about 1 to about 8, preferably ranging from about 2 to about 6, most preferably being about 2.8. The etch composition can be mixed during an exothermic reaction. The wet etch may be conducted in an oxygen-containing environments and may be conducted at room temperature or at an elevated temperature. Preferably, the etch temperature is 15° C. to 80° C. Following etch, the block mask 50 is removed using a chemical strip and the substrate 12 is rinsed with deionized water and dried in a $N_2$ ambient.

Figure 7:
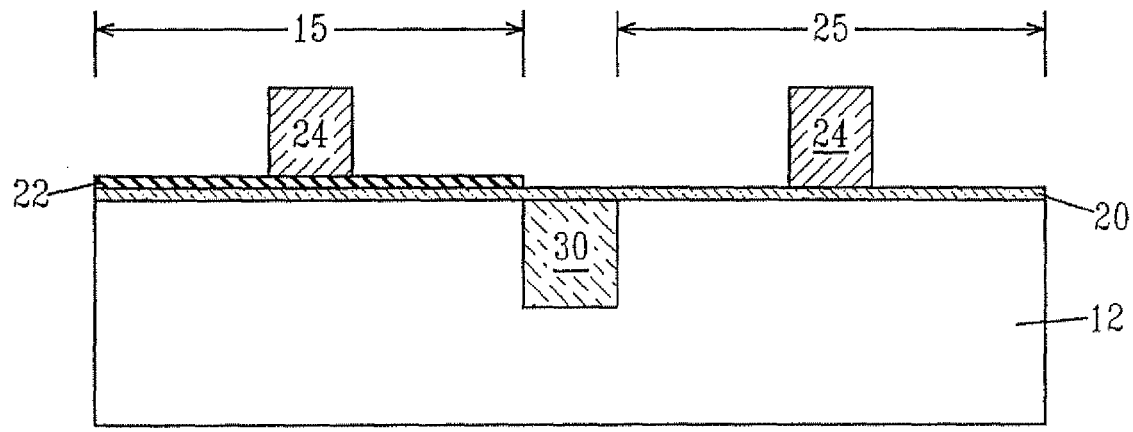

Referring now to FIG. 7, in a next process step, at least one gate conductor 24 is formed in the pFET device region 15 and the nFET device region 25. The gate conductor 24 may comprise any conductive material known by those skilled in the art. For example, the gate conductor material can comprise polysilicon but may also be comprised of SiGe, SiGeC, metal silicides, metallic nitrides, metals (for example W, Ir, Re, Ru, Ti, Ta, Hf, Mo, Nb, Ni, Al), or a combination of the above. The at least one gate conductor may be deposited using chemical vapor deposition (CVD), plasma-enhanced chemical vapor deposition (PECVD), high-density chemical vapor deposition (HDCVD), plating, sputtering, evaporation or chemical solution deposition.

The gate conductor 24 formed in the pFET device region 15 and the nFET device region 25 may be the same or a different material. In the embodiment in which the gate regions 24 comprise a different material, block masks may be utilized to selectively process the gate conductor 24 materials in the pFET device region 15 and the nFET device region 25.

In one embodiment of the present invention wherein the gate conductor comprises a Si-containing material, a blanket layer of a Si-containing material is formed on the insulating interlayer 22 in the pFET device region 15 and on the high k dielectric 20 in the NFET device region 25 utilizing a known deposition process including, but not limited to: physical vapor deposition, CVD or evaporation.

The Si-containing material used in forming the gate conductor 24 includes Si or a SiGe alloy layer in single crystal, polycrystalline or amorphous form. Combinations of the aforementioned Si-containing materials are also contemplated herein. The blanket layer of Si-containing material may be doped or undoped. If doped, an in-situ doping deposition process may be employed in forming the same.

Alternatively, a doped Si-containing layer can be formed by deposition, ion implantation and annealing. The doping of the Si-containing layer will shift the workfunction of the gate conductor 24 formed. Illustrative examples of dopant ions include As, P, B, Sb, Bi, In, Al, Ga, or mixtures thereof preferably being P. The thickness, i.e., height, of the Si-containing layer deposited at this point of the present invention may vary depending on the deposition process employed. Typically, the Si-containing layer has a vertical thickness from about 20 to about 180 nm, with a thickness from about 40 to about 150 nm being more typical.

After deposition of the blanket layer of gate conductor material, a dielectric cap layer (not shown) can be formed atop the blanket layer of gate conductor material utilizing a deposition process such as, for example, physical vapor deposition or chemical vapor deposition. The dielectric cap layer may be an oxide, nitride, oxynitride or any combination thereof. The thickness, i.e., height, of the dielectric cap layer is from about 20 to about 180 nm, with a thickness from about 30 to about 140 nm being more typical.

The dielectric cap (if present), the blanket gate conductor layer, and optionally the insulating interlayer 22 and the high k gate dielectric 20 in the pFET device region 15 and the high k gate dielectric in the nFET device region 25 are then patterned by lithography and etching so as to provide at least one patterned gate stack 18 in the nFET and pFET device regions 15, 25. When a plurality of patterned gate stacks 18 are formed, the gate stacks 18 may have the same dimension, i.e., length, or they can have variable dimensions to improve device performance. Each patterned gate stack 18 at this point of the present invention includes at least the gate conductor 24.

The lithography step includes applying a photoresist to the upper surface of the blanket layered structure, exposing the photoresist to a desired pattern of radiation and developing the exposed photoresist utilizing a conventional resist developer. The pattern in the photoresist is then transferred to the structure utilizing one or more dry etching steps. In some embodiments, the patterned photoresist may be removed after the pattern has been transferred into one of the layers of the blanket layered structure. In other embodiments, the patterned photoresist is removed after etching has been completed.

Suitable dry etching processes that can be used in the present invention in forming the patterned gate stacks include, but are not limited to: reactive ion etching, ion beam etching, plasma etching or laser ablation. The dry etching process employed is typically, but not always, selective to the underlying high k dielectric 20 in the NFET device region 25 and the insulating interlayer 22 in the pFET device region 15. Therefore this etching step does not typically remove the exposed portions of the insulating interlayer 22 and the high k dielectric 20. In some embodiments, this etching step may however be used to remove portions of the high k dielectric 20 and the insulating interlayer 22 that are not protected by the gate conductor 24 that were previously etched.

Figure 8:
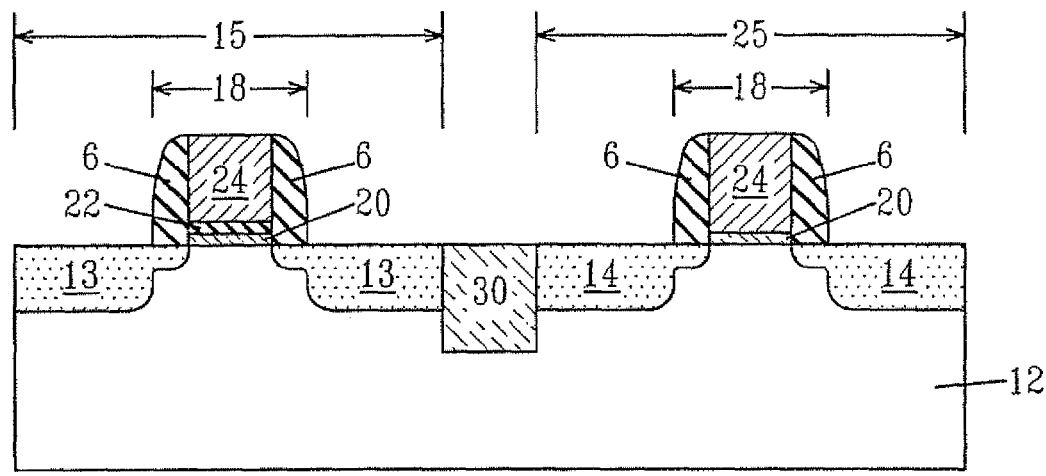

Referring to FIG. 8, at least one set of spacers 6 is typically, but not always, formed on exposed sidewalls of each patterned gate stack 18. The at least one set of spacers 6 is comprised of an insulator such as an oxide, nitride, oxynitride and/or any combination thereof. The at least one set of spacers 6 is formed by deposition and etching.

The width of the at least one spacer 6 must be sufficiently wide such that the source and drain silicide contacts (to be subsequently formed) do not encroach underneath the edges of the gate stack. Typically, the source/drain silicide does not encroach underneath the edges of the gate stack when the at least one spacer has a width, as measured at the bottom, from about 20 to about 80 nm.

The gate stack 18 can also be passivated at this point of the present invention by subjecting the same to a thermal oxidation, nitridation or oxynitridation process. The passivation step forms a thin layer of passivating material about the gate stack. This step may be used instead or in conjunction with the previous step of spacer formation. When used with the spacer formation step, spacer formation occurs after the gate stack passivation process.

Source/drain diffusion regions 13, 14 (with or without the spacers present) are then formed into the substrate. The source/drain diffusion regions 13, 14 are formed utilizing ion implantation and an annealing step. P-type source/drain diffusion regions 13 are formed within the pFET device region 15 and n-type source/drain diffusion regions 14 are formed within the nFET device region 25. The annealing step serves to activate the dopants that were implanted by the previous implant step. The conditions for the ion implantation and annealing are well known to those skilled in the art.

The source/drain diffusion regions 13, 14 may also include extension implant regions, which are formed prior to source/drain implantation using a conventional extension implant having the same dopant type as the corresponding source/drain diffusion regions. The extension implant may be followed by an activation anneal, or alternatively the dopants implanted during the extension implant and the source/drain implant can be activated using the same activation anneal cycle. Halo implants are also contemplated herein.

Next, and if not previously removed, the exposed portion of the high k dielectric 20 is removed from the nFET device region 25 and the exposed portions of the insulating interlayer 22 and the high k dielectric 20 are removed from the pFET device region 25 utilizing a highly selective chemical etching process. This etching step stops on an upper surface of the semiconductor substrate 12. Although any chemical etchant may be used in removing the exposed portions of the high k dielectric 20 and the insulating interlayer 22, in one embodiment dilute hydrofluoric acid (DHF) is used.

Of the various combinations and embodiments described above, a particular preferred CMOS structure of the present invention is one in which the high k gate dielectric 20 is comprised of $HfO_2$, hafnium silicate or hafnium silicon oxynitride and the insulating interlayer 22 is comprised of AlN, which optionally may include some oxygen therein. Other variations and permutations of the particularly preferred structure are also contemplated herein and should not be excluded.

Further CMOS processing such as formation of silicided contacts (source/drain and gate) as well as formation of BEOL (back-end-of-the-line) interconnect levels with metal interconnects can be formed utilizing processing steps that are well known to those skilled in the art.

The following examples are provided for illustrative purposes to demonstrate the importance of a CMOS structure, in which the inventive insulating interlayer 22 positioned only within pFET devices and removed from nFET devices.

EXAMPLE 1

In this example, a Hf oxide or silicate layer (high k dielectric) was grown on a silicon substrate that was pre-patterned with an isolation region separating an nFET device region from a pFET device region. The Hf oxide and silicate were deposited using metal organic chemical vapor deposition (MOCVD) and atomic layer chemical vapor deposition (AL-CVD). The thicknesses of the Hf oxide and silicate layers were in the range of about 2 nm to about 4 nm and for the silicates, the composition was approximately $Hf_xSi_yO_4$ with $y/(x+y)$ being approximately 0.2-0.3. These oxides were deposited on an n-type silicon wafer having 0.3 nm to 1.2 nm thick silicon oxide or silicon oxynitride coating. The presence of this silicon oxide or silicon oxynitride coating is optional.

Following deposition of the Hf oxide and silicate, the wafers were loaded in an ultra-high vacuum deposition chamber for aluminum nitride deposition (insulating interlayer). Aluminum nitride was deposited by evaporating Al from a standard Al effusion cell that is resistively heated, and using a nitrogen beam from a commercial radio frequency atomic nitrogen source. The effusion cell had a temperature of 1000° C.-1200° C. during operation. The atomic nitrogen source was operated in the range of 200-450 W and a nitrogen flow rate of 1-3 sccm. The substrate temperature was kept between 150° C. to 650° C. during deposition. Base vacuum chamber pressure was about $5 \times 10^{-10}$ to $2 \times 10^{-9}$ torr. During AlN deposition the pressure rose to the $1 \times 10^{-5}$ torr range. The AlN layers were deposited to a thicknesses ranging from about 0.5 nm to about 2.0 nm.

The substrates were then taken out and etched in a HCl: $H_2O_2$ peroxide solution to remove the AlN layers, with no external heat supplied. The concentrations of this etchant solution comprised greater than 1 part HCl and greater than 1.5 parts $H_2O_2$, wherein an acidic solution was provided. The preferred concentration comprises 3:1HCl: $H_2O_2$. It is noted that the pH resulting from the choice of concentration as described-above will impact the etch rate. After etching, the substrates were rinsed with de-ionized water and dried in a $N_2$ ambient to provide a substrate having a Hf oxide surface.

An amorphous silicon layer (gate conductor layer) was then deposited atop the substrate surface to a thickness of approximately 150 nm thick using chemical vapor deposition using standard procedures. The amorphous silicon layer was then ion implanted with phosphorus and the dopants activated by annealing at approximately 950° C. to approximately 1000° C., again following standard semiconductor processing procedures. In some cases, forming gas anneals were performed for $SiO_2/Si(100)$ interface state passivation.

NMOS test capacitors were then formed from these above structures using chemical vapor deposition and etching to define pad shapes on the order of about 20×20 square microns. The nMOS test capacitor structures were etched using the above-described method to remove the AlN layer to provide a structure comprising a phosphorus doped polysilicon layer; a layer of Hf silicate or $HfO_2$ having a thickness ranging from about 2 nm to about 4 nm; and an $SiO_2$ or SiON layer having a thickness ranging from about 0.3 nm to about 1.2 nm; and a silicon (100) substrate. Polysilicon/Hf silicate or $HfO_2$/SiON nMOS control capacitors, in which an AlN layer had never been incorporated or etched away, were provided for comparison.

Figure 9:
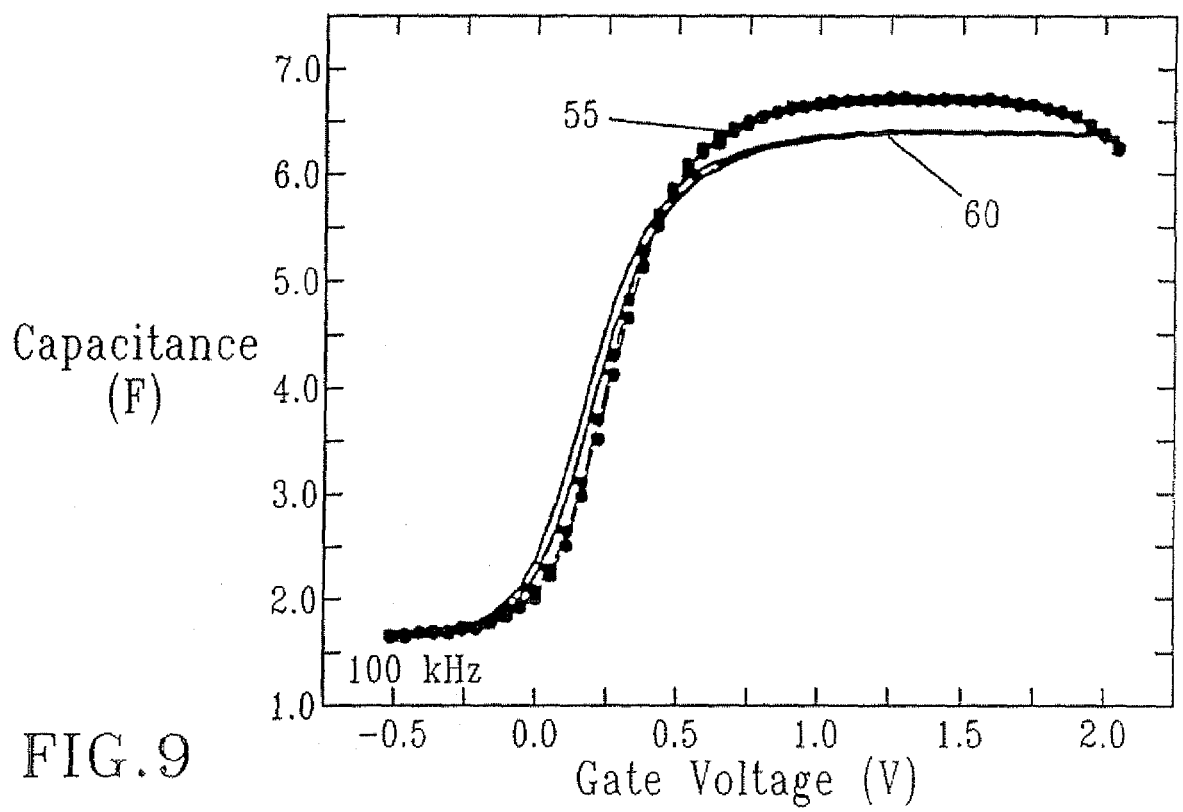
FIG. 9 is a plot showing capacitance voltage characteristics of the inventive CMOS structure, in which the insulating interlayer has been removed from the NFET device.

The capacitors where then tested electrically to provide capacitance v. voltage plots, as depicted in FIG. 9. Capacitance-voltage curves for nMOS test capacitors with Hf silicate or $HfO_2$ as the gate dielectric and having an AlN layer deposited thereon and then removed by the selective etch of the present invention are indicated by reference number 55. Capacitance-voltage curves for the control capacitors are indicated by reference number 60. The flatband voltage $V_{fb}$ in the capacitance voltage curves for the capacitors is equivalent to threshold voltage $V_{t\ in}$ transistors.

Still referring to FIG. 9, comparison of the flatband voltage $V_{fb}$ of the test capacitors to the control capacitors indicates that the flatband voltage $V_{fb}$ of the test capacitors was within 70 mV of the control capacitors. Therefore, since AlN can be removed from the surface of the test capacitors without substantially degrading the device's flatband voltage $V_{fb}$; the etch chemistries of the present invention can advantageously remove AlN without etching the underlying Hf silicate or $HfO_2$ high k dielectric or disadvantageously effecting the electrical properties of the Hf silicate or $HfO_2$ high k dielectric.

Figure 10:
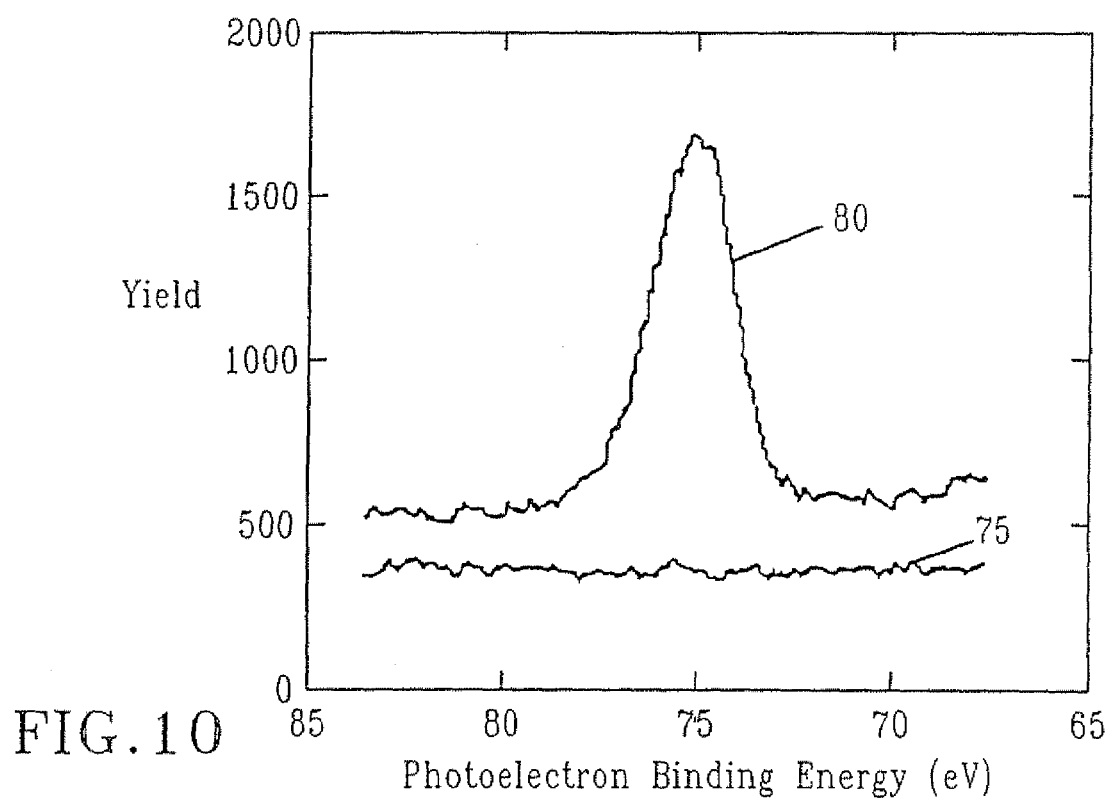
FIG. 10 is an XPS spectra depicting AlN content following the inventive selective etch process.

Referring now to FIG. 10, an XPS spectra is provided of a blanket AlN film etched from a hafnium silicate surface by an etch chemistry comprising a HCl:$H_2O_2$ solution in 3:1 ratio for 15 minutes. Referring to FIG. 10, the XPS spectra of the HCl/peroxide etched surface is indicated by reference number 75 and the XPS surface of an AlN control surface is indicated by reference number 80. As indicated in the XPS spectra depicted in FIG. 10, the Al 2P peak detected from the AlN control surface is not present in the AlN film which was etched from the hafnium surface by the HCl/peroxide solution. The selectivity to hafnium silicate was confirmed using the ellipsometry measurements, which showed no change in the thickness of the hafnium silicate film.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What we claim is:

1. A method of forming a complementary metal oxide semiconductor (CMOS) structure having improved threshold voltage and flatband voltage stability comprising:

providing a semiconductor substrate having a first device region and a second device region;

forming a dielectric stack atop said semiconductor substrate including said first device region and said second device region, said dielectric stack comprising an insulating interlayer atop a high k dielectric, the high k dielectric present on the semiconductor substrate;

removing said insulating interlayer from said first device region, without removing said insulating interlayer from said second device region;

forming a gate conductor atop said insulating interlayer in said second device region and said high k dielectric in said first device region, wherein the first device region is an area for at least one nFET device and said second device region is an area for at least one pFET device, wherein said insulating interlayer stabilizes said second device regions threshold voltage and flatband voltage without shifting said first device region's threshold voltage and flatband voltage; and etching said gate conductor, said insulating interlayer and said high k dielectric to provide at least one gate stack in said second device region and at least one gate stack in said first device region, wherein the at least one gate stack in the first device region comprises, from bottom to top, the high k gate dielectric disposed directly on said semiconductor substrate and the gate conductor disposed on the high k gate dielectric, and the at least one gate stack in the second device region comprises, from bottom to top, the high k gate dielectric disposed directly on said semiconductor substrate, an insulating interlayer atop said high k gate dielectric, and the gate conductor atop said insulating interlayer.

2. The method of claim 1 wherein said insulating interlayer comprises an insulating metal nitride.

3. The method of claim 2 wherein said insulating metal nitride further comprises oxygen.

4. The method of claim 1 wherein said insulating interlayer comprises aluminum nitride (AlN), aluminum oxynitride ($AlO_xN_y$), boron nitride (BN), boron oxynitride ($BO_xN_y$), gallium nitride (GaN), gallium oxynitride (GaON), indium nitride (InN), indium oxynitride (InON) or combinations thereof.

5. The method of claim 1 wherein said insulating interlayer comprises AlN or $AlO_xN_y$.

6. The method of claim 1 wherein said high k dielectric comprises $HfO_2$, hafnium silicate or hafnium silicon oxynitride.

7. The method of claim 1 wherein said insulating interlayer is formed by deposition or thermal growing.

8. The method of claim 7 wherein said deposition comprises plating, sputtering, atomic layer chemical vapor deposition (ALCVD) or metal organic chemical vapor deposition (MOCVD).

9. The method of claim 1 wherein said high k dielectric is formed by deposition or thermal growing.

10. The method of claim 9 wherein said deposition comprises chemical vapor deposition (CVD), plasma-enhanced CVD (PECVD), metal organic chemical vapor deposition (MOCVD), high-density chemical vapor deposition (HDCVD), plating, sputtering, evaporation or chemical solution deposition.

11. The method of claim 9 wherein said thermal growing comprises oxidation, nitridation, or oxynitridation.

12. The method of claim 1 wherein said gate conductor comprises Si, Ge, SiGe, SiGeC, W, Ir, Re, Ru, Ti, Ta, Hf, Mo, Nb, Ni, Al, metal silicides, metallic nitrides, or a combination thereof.

13. The method of claim 1 wherein removing said insulating interlayer from said first device region without removing said insulating interlayer from said second device region further comprises forming a block mask atop said second device region, wherein said first device region is exposed; and etching said insulating interlayer from said first device region, said etching comprising an etch chemistry that removes said insulating interlayer without substantially etching said block mask and said high k dielectric in said first device region.

14. The method of claim 13 wherein said block mask comprises a patterned photoresist layer.

15. The method of claim 14 wherein forming said block mask comprises blanket depositing a photoresist layer atop said semiconductor substrate;

exposing said photoresist layer to a pattern of radiation; and developing said pattern into said photoresist layer to provide said block mask overlying said second device region.

16. The method of claim 13 wherein said block mask comprises a dielectric selected from the group consisting of silicon oxides, silicon carbides, silicon nitrides, silicon carbonitrides, silsequioxanes, siloxanes, and boron phosphate silicate glass (BPSG).

17. The method of claim 13 wherein said etch chemistry is a wet etch comprising HCl and an oxidizing agent.

18. The method of claim 17 wherein said etch chemistry has a pH ranging from about 1 to about 7.

19. The method of claim 18 wherein said etch chemistry has a pH ranging from about 2 to about 6.

20. The method of claim 17 wherein said etch chemistry comprises a 3:1 $HCl/H_2O_2$ peroxide solution.

21. The method of claim 13 wherein said insulating interlayer comprises aluminum nitride (AlN), aluminum oxynitride ($AlO_xN$), boron nitride (BN), boron oxynitride ($BO_xN_y$), gallium nitride (GaN), gallium oxynitride (GaON), indium nitride (InN), indium oxynitride (InON) or combinations thereof.

22. The method of claim 13 wherein said insulating interlayer comprises AlN.

* * * * *